United States Patent
Kawauchi et al.

[11] Patent Number: 5,825,314
[45] Date of Patent: Oct. 20, 1998

[54] VARIABLE-LENGTH CODE DECODER

[75] Inventors: Kenichi Kawauchi; Taro Yokose; Yutaka Koshi; Koumei Tomida; Eiri Hashimoto, all of Nakai-machi, Japan

[73] Assignee: Fuji Xerox Co., Ltd., Tokyo, Japan

[21] Appl. No.: 717,946

[22] Filed: Sep. 23, 1996

[30] Foreign Application Priority Data

Mar. 11, 1996 [JP] Japan ................... 8-053225

[51] Int. Cl.$^6$ ............................ H03M 7/40
[52] U.S. Cl. ............................ 341/67; 341/65
[58] Field of Search ........................ 341/65, 67

[56] References Cited

U.S. PATENT DOCUMENTS

| | | | |
|---|---|---|---|
| 5,126,738 | 6/1992 | Sasaki | 341/67 |
| 5,220,325 | 6/1993 | Ackland et al. | 341/67 |
| 5,428,356 | 6/1995 | Ozaki | 341/67 |
| 5,621,405 | 4/1997 | Park et al. | 341/67 |

FOREIGN PATENT DOCUMENTS

A-7-212242   8/1995   Japan .

Primary Examiner—Jeffrey A. Gaffin
Assistant Examiner—Jason L W Kost
Attorney, Agent, or Firm—Oliff & Berridge, PLC

[57] ABSTRACT

The present invention provides a variable-length code decoder for inputting a code data bit string having a predetermined number of code data bits in every decoding cycle and decoding it, which comprises storing means for storing a decoded symbol and a node in a code tree in the next decoding cycle corresponding to each combination of a value of the code data bit string and a node in the code tree, reading means for reading the decoded symbol and the node in the code tree in the next decoding cycle from the storing means in accordance with the code data bit string inputted in a current decoding cycle and the node in the code tree in the current decoding cycle, outputting means for outputting the decoded symbol read by the reading means, and providing means for providing the node in the code tree in the next decoding cycle read by the reading means to the reading means.

13 Claims, 6 Drawing Sheets

|         | $S_1$ | $S_2$ | $S_3$ | ...... | $S_{n-1}$ |
|---------|-------|-------|-------|--------|-----------|
| 0       | $d_{1,0}$ | $d_{2,0}$ | $d_{3,0}$ | ...... | $d_{n-1,0}$ |
| ADDRESS 1 | $d_{1,1}$ | $d_{2,1}$ | $d_{3,1}$ | ...... | $d_{n-1,1}$ |
| 2       | $d_{1,2}$ | $d_{2,2}$ | $d_{3,2}$ | ...... | $d_{n-1,2}$ |
| ......  | ...... | ...... | ...... | ...... | ...... |
| $2^m-1$ | $d_{1,2^m-1}$ | $d_{2,2^m-1}$ | $d_{3,2^m-1}$ | ...... | $d_{n-1,2^m-1}$ |

|  | | $S_1$ | $S_1$ |
|---|---|---|---|
|  | 0 | $S_1/a1a1$ | $S_1/a2a1$ |
| ADDRESS | 1 | $S_2/a1$ | $S_2/a2$ |
|  | 2 | $S_1/a2$ | $S_1/a3a1$ |
|  | 3 | $S_1/a3$ | $S_2/a3$ |

VARIABLE-LENGTH CODE DECODER

BACKGROUND OF THE INVENTION

1. Field of the Invention

The present invention relates to a decoder dealing with a code having a variable bit-unit length and in particular relates to a decoder capable of high-speed decoding based on observation of states of a code tree.

2. Discussion of the Related Art

Generally, in the case of coding a time series signal having uneven frequency of occurrence, it is known that the compression coding can be realized by using a variable-length code which assigns a short code to the signal of high frequency of occurrence, and a long code to the signal of low frequency of occurrence. Such coding is called entropy coding. The Huffman coding is one of the kinds of the entropy coding.

The entropy coding is widely applied to, for example, coding of the voice signal or image signal.

"Code tree" is one of the data expressions in which it is possible to reach an ultimate decoding data by traversing the node corresponding to the current processing node and inputted code data bit. "Huffman tree" is one of the kinds of code tree.

Here, operation on the Huffman coding is briefly described. FIG. 8 shows state transition by the Huffman tree and FIG. 9 shows a variable-length code table. As shown in FIG. 9, the variable-length code is assigned to each of symbols a1 to a7 in accordance with the frequency of occurrence. As FIG. 8 shows, the state transition by the Huffman tree provides procedures of advancing decoding by traversing those codes one by one from the top of the tree. The black dots S1 to S6 in FIG. 8 are nodes showing an initial state (S1) and intermediate states (S2 to S6) in the decoding procedures, which are (the number of symbols-1) in number. On starting decoding, the process proceeds from S1: if the first bit in decoding is 0, the process traverses the branch of 0 to transit to the state of S2. if the first bit is 1, the process traverses the branch of 1 to transit to the state of S4. As a result of repeating such transition per every bit, the process reaches the symbols a1 to a7, thus completing the decoding.

In the method of decoding by traversing the Huffman tree bit by bit as described above, only one bit can be processed in each cycle, and therefore, a method of processing variable-length codes at one time while the code and the code length are decoded in parallel for executing the high speed decoding process has been considered.

As an example of the method, Japanese Patent Application Laid-Open No. Hei. 7-212242 (1995) discloses a variable-length code decoder. FIG. 10 is a block diagram showing a construction of the device, in which an input buffer 9 is constituted by a pair of latches L1 and L2 and stores compression data 8. The bit number of each of latches L1 and L2 is equal to a maximum length codeword used in this system (for example, p bits). A barrel shifter 10 has a bit number which is twice as the maximum length codeword (for example, 2p bits) and shifts the data of the input buffer 9 in accordance with a codeword length signal 13 generated by a length control PLA 12. A decode PLA 11 decodes p bits outputted from the barrel shifter 10 and outputs a decoded symbol 14. As same as the decode PLA 11, the length control PLA 12 decodes p bits outputted from the barrel shifter 10, determines the length of the symbol to be decoded and then outputs it. If two or more specific short codes are successively outputted from the barrel shifter 10, the decode PLA 11 decodes them at once in a cycle, thus realizing high speed decoding.

In a conventional art, as shown in FIG. 11, a loop is formed by a decoding PLA 15 and a barrel shifter 10. The decoding PLA 15 comprises the decode PLA 11 and the length control PLA 12, and outputs the decoded symbol 14 and the codeword length 13 on receiving the output form the barrel shifter 10. Owing to the loop, in the case of high operation frequency (for example, 70 MHz or more), the high speed decoding cannot be carried out according to the conventional art. That is, if the operation frequency increases, each of processings of the length control PLA and barrel shifter requires one cycle, and as a result, the process of the loop requires two cycles though both of the processings of the length control PLA and the barrel shifter were executed in one cycle before the operation frequency increased. Consequently, if the operation frequency increases, decoding is carried out only once in two cycles, whereby the efficiency and performance are decreased.

SUMMARY OF THE INVENTION

The present invention has been made in view of the above circumstances and has an object to provide a variable-length code decoder capable of decoding one or more codes in every one cycle, that is, to provide a high speed variable-length code decoder which can decode at a speed as twice as that of the conventional variable-length code decoder.

Another object of the present invention is to provide a variable-length code decoder capable of efficient coding utilizing the state of the code tree, not the length of the code.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims. To achieve the objects and in accordance with the purpose of the invention, as embodied and broadly described herein, a variable-length code decoder for inputting a code data bit string having a predetermined number of code data bits in every decoding cycle and decoding it according to the present invention comprises storing means for storing a decoded symbol and a node in a code tree in the next decoding cycle corresponding to each combination of a value of the code data bit string and a node in the code tree, reading means for reading the decoded symbol and the node in the code tree in the next decoding cycle from the storing means in accordance with the code data bit string inputted in a current decoding cycle and the node in the code tree in the current decoding cycle, outputting means for outputting the decoded symbol read by the reading means, and providing means for providing the node in the code tree in the next decoding cycle read by the reading means to the reading means.

BRIEF DESCRIPTION OF THE DRAWINGS

The accompanying drawings, which are incorporated in and constitute a part of this specification illustrate embodiment of the invention and, together with the description, serve to explain the objects, advantages and principles of the invention. In the drawings.

DETAILED DESCRIPTION OF THE PREFERRED EMBODIMENT

Preferred embodiment of a variable-length code decoder according to the present invention is now described in detail based on the drawings.

First Embodiment

Figure 1:
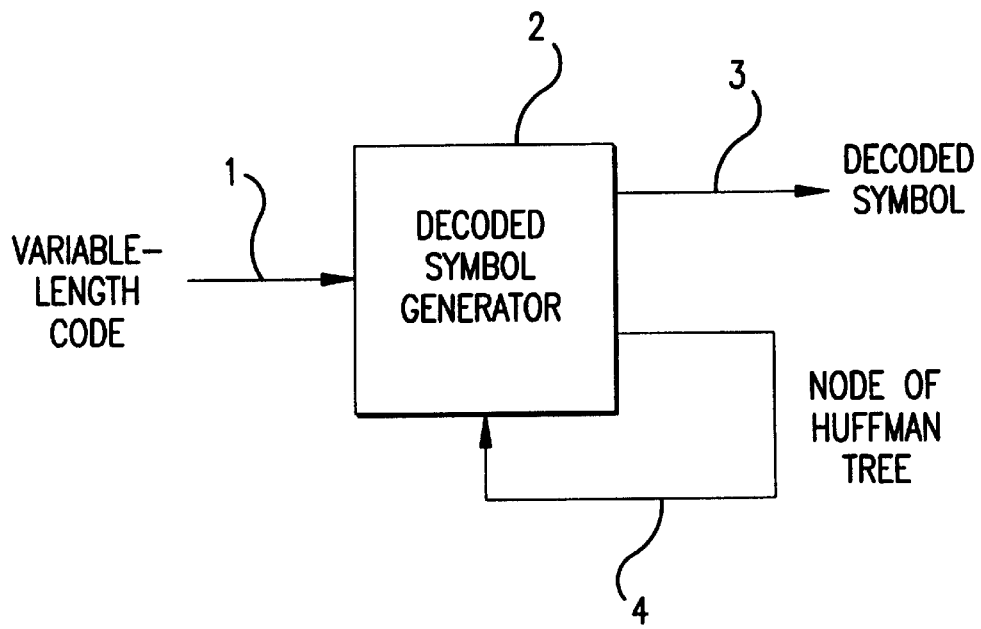
FIG. 1 is a block diagram showing a basic construction of an embodiment of a variable-length code decoder according to the present invention.

FIG. 1 is a block diagram showing a basic construction of a variable-length code decoder according to the present invention. In the figure, a decoded signal generator 2 holds a node (state) of the Huffman tree in the next decoding cycle and a decoded symbol in the current decoding cycle as data, and on receiving variable-length code data, outputs the decoded symbol and the node of the Huffman tree through signal lines 3 and 4.

In this construction, the variable-length code data is inputted to the decoded symbol generator 2 through a signal line 1, and at the same time, the node of the Huffman tree is also inputted thereto through a signal line 4. In the decoded symbol generator 2, the data of the decoded symbol and the node of the Huffman tree in the next decoding cycle is held for every combination of the variable-length code data and the current node of the Huffman tree. The decoded symbol generator 2 receives the variable-length code data and the current node of the Huffman tree as an entry, and then selects and outputs the desired decoded symbol and the node of the Huffman tree in the next decoding cycle. Among the selected data, the decoded symbol in the current decoding cycle is outputted through the signal line 3. The node of the Huffman tree in the next decoding cycle among the selected data is returned to the decoded symbol generator 2 through the signal line 4 to be used in the next decoding cycle.

In this way, it is possible to return a part of the data (node of the Huffman tree) held in the decoded symbol generator 2 to the decoded symbol generator 2 without executing any processing according to this embodiment of the variable-length code decoder. Consequently, a short loop by the signal line 4 of the node of the Huffman tree is sufficient to execute processing in one cycle even in the case where the operation frequency is high (for example, 70 MHz or more). Thereby one decoding is possible in every one cycle, and moreover, if code data having the maximum codeword length of the code is fetched in one cycle, it is possible to decode one or more codes in one cycle.

Figure 2:
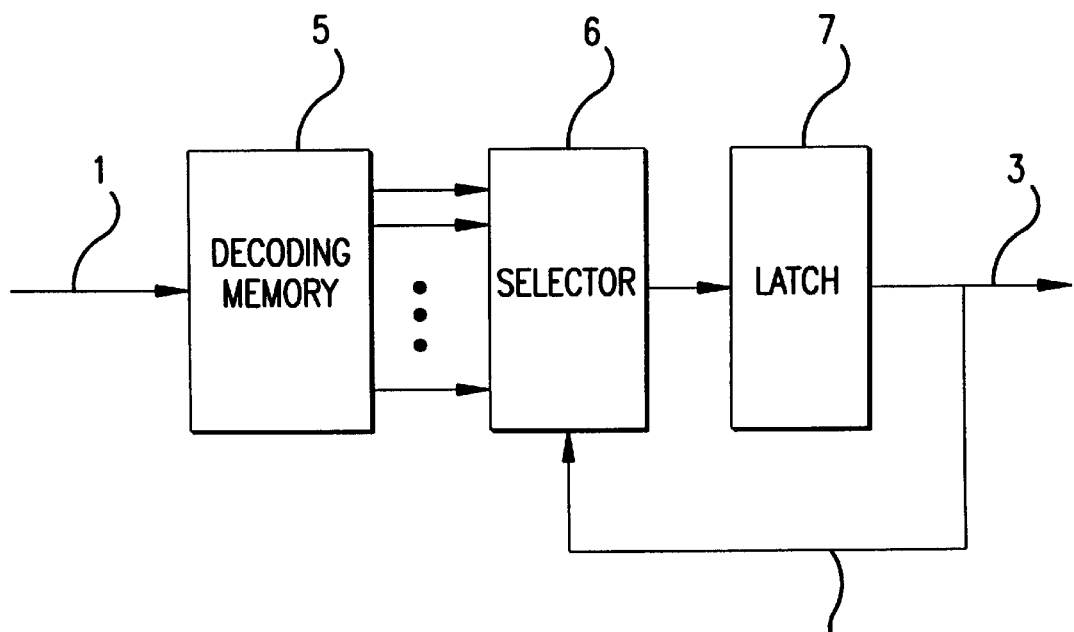
FIG. 2 is a block diagram showing a concrete construction of the embodiment of the variable-length code decoder according to the present invention.

FIG. 2 is a block diagram showing a concrete construction of the variable-length code decoder according to the present invention. In the figure, the variable-length code decoder has a decoding memory 5, a selector 6, the latch 7, and so forth. The decoding memory 5 stores the node (state) of the Huffman tree in the next decoding cycle and the decoded symbol in the current decoding cycle, and outputs these data according to the variable-length code data inputted as an address.

Figures 3, 4:
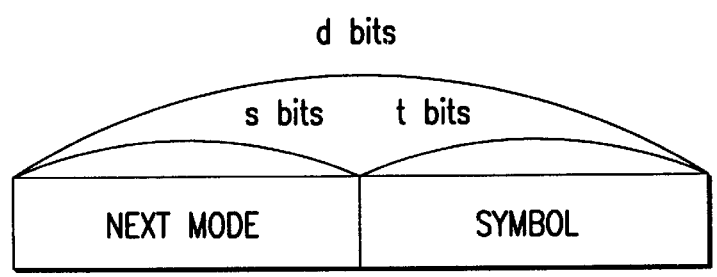
FIG. 3 shows a construction of a memory for decoding in the case where the bit width of the variable-length code data is m and the number of decoded symbols is n.
FIG. 4 shows a construction of data in the decoding memory.
Figure 8:
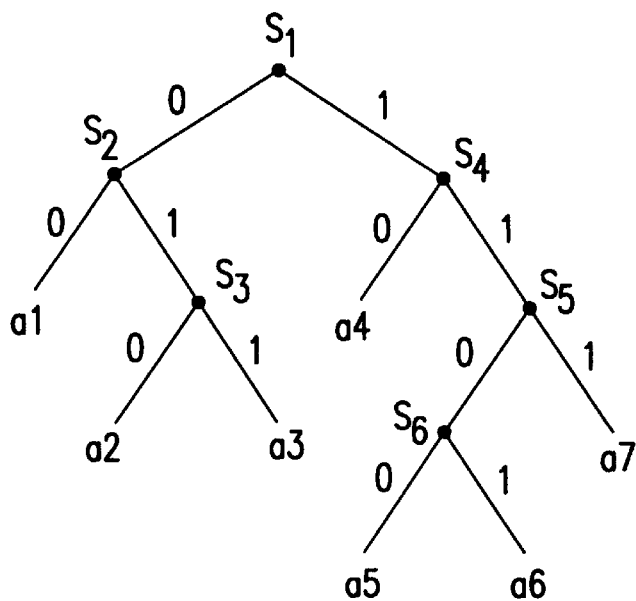
FIG. 8 shows the state transition by the Huffman tree.
Figures 9, 10:
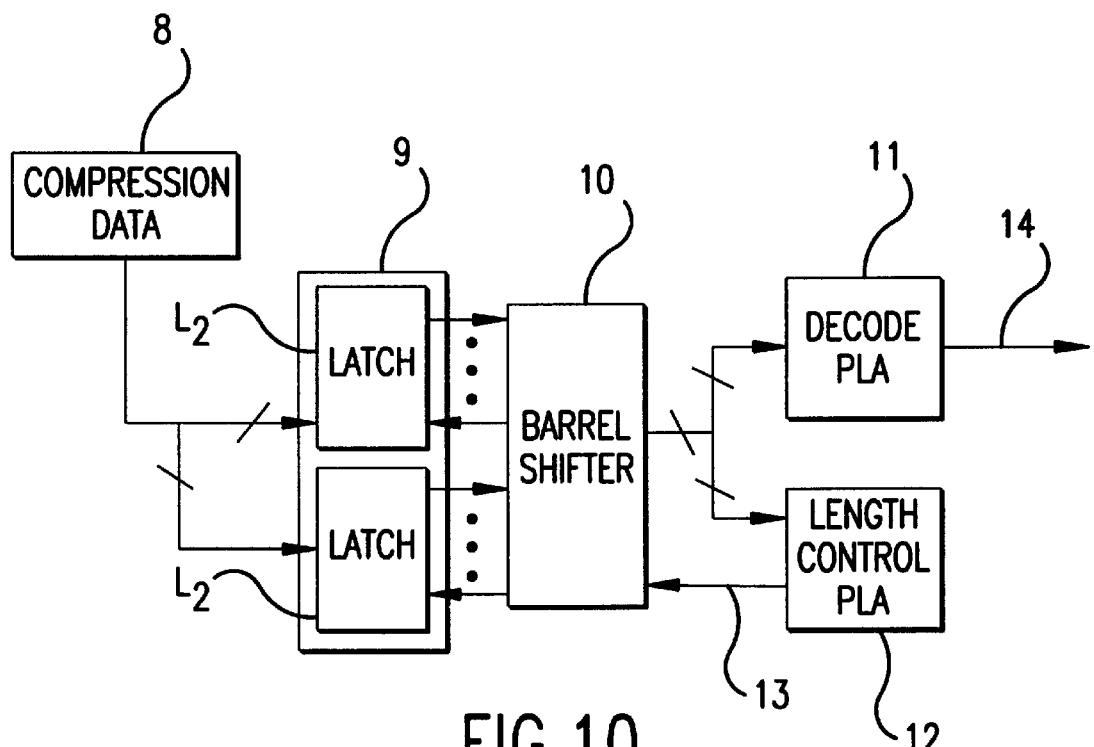
FIG. 9 shows a variable-length code table.
FIG. 10 is a block diagram showing a construction of a conventional variable-length code decoder.
Figure 11:
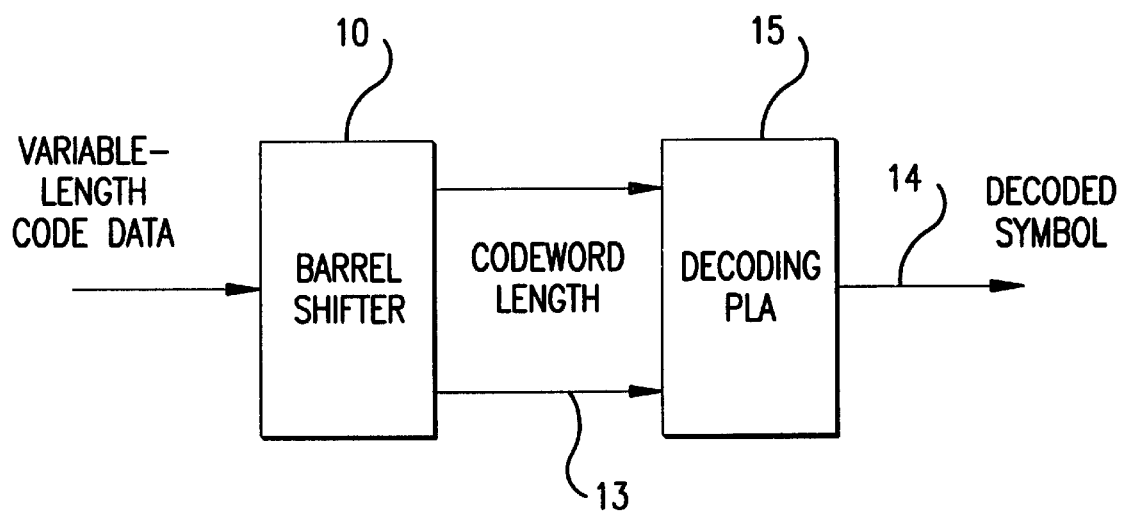
FIG. 11 is a block diagram showing a construction of a loop in the conventional variable-length code decoder.

FIG. 3 shows a construction of the above-described decoding memory 5 in the case where the number of bits is m and the number of decoded symbols is n. In the figure, the rows S1, S2, S3, . . . , Sn−1 represent the nodes (states) of the Huffman tree as shown in FIG. 8. The lines 0, 1, 2, . . . , 2m−1 are the addresses of the decoding memory 5. Each line corresponding to the address forms a word. That is, if the data (dx, y) of each node is d bits, for example, the number of bits of one word is d×(n−1) bits, and therefore, the capacity of the decoding memory 5 is d×(n−1)×2m bits. Here, (dx, y) indicates data where the node of the Huffman tree is x and the address is y. As shown in FIG. 4, (dx, y) consists of the next node (the node of the Huffman tree in the next decoding cycle, s bits) and the decoded symbol (t bits).

In FIG. 2, the selector 6 selects required data according to a selection signal 4 among the data outputted from the decoding memory 5. The latch 7 holds the output from the selector 6. A part of the output from the latch 7 (the node of the Huffman tree in the next cycle) works as the selection signal 4 for the selector 6.

Figures 5, 6:
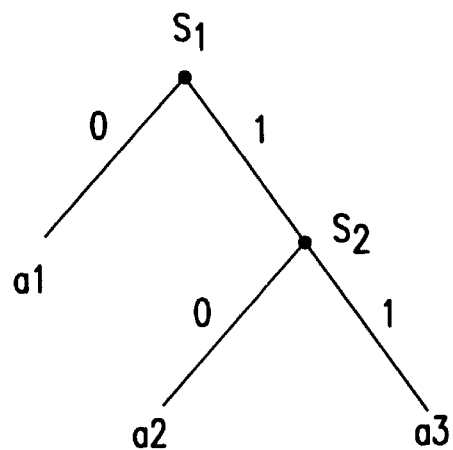
FIG. 5 shows a state transition by Huffman tree for illustration of operation of the concrete construction of the embodiment of the variable-length code decoder shown in FIG. 2.
FIG. 6 shows a construction of a decoding memory corresponding to the Huffman tree.

Next the operation of the above embodiment is described. For simplification, three types of symbols a1, a2 and a3, and the variable-length code data with the bit width of 2 bits are assumed. FIG. 5 shows the state transition by the Huffman tree in this case. In the figure, it is assumed that there are nodes S1 and S2, and that the symbols a1, a2 and a3 are assigned codes 0, 10 and 11, respectively. FIG. 6 shows the construction of the decoding memory 5 corresponding to the Huffman tree in FIG. 5. In FIG. 6, four types of addresses 0 to 3 exist because the bit width of the variable-length code data is 2 bits. In the data of the decoding memory 5, the left side of "/" represents the next node, and the right side represents the decoded symbol. In some cases the data has two decoded symbols (for address 0, in column S1, a1a1, in column S2, a2a1, and for address 2, in column S2, a3a1): in a time series of the output symbol, the left side one (a1, a2 and a3) is outputted earlier, and the right side one (a1, a1 and a1) is later.

Here, the case where the plural decoded symbols are stored means that the path between the current node and the decoded symbol to be obtained is the same as the length of the code data bit string or less, and the path between the starting node of the tree and the decoded symbol to be obtained is the same as the length of the remaining code data bit string or less. To be more concrete, in the tree in FIG. 5, it is supposed that a string of codes 1, 0 is inputted. If the state is S2 on that occasion, the decoded symbol a3 is obtained according to the code 1 and thereby the state becomes S1, and the decoded symbol a1 is obtained according to the code 0. Consequently, the decoding memory 5 must store the plural decoded symbols a1 and a3 for the string S2 with the address 2. Here the path means that the number of links which are passed through for transferring from one state to another supposing that the number of link is 1 when transfer from one state to the next state is carried out.

In the case other than the above-described, it is enough to store one decoded symbol.

Figure 7:
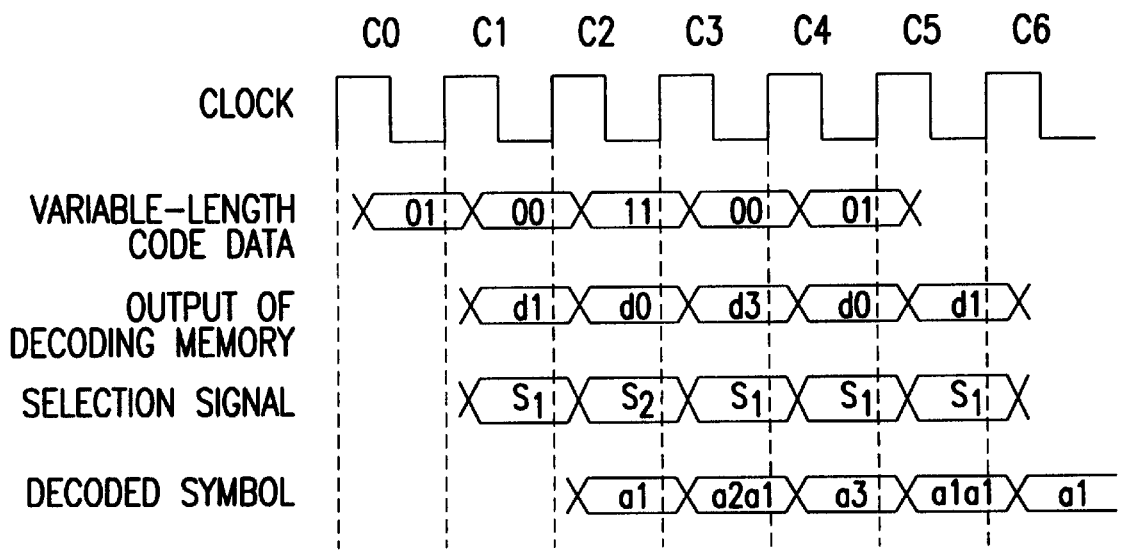
FIG. 7 shows a variable-length code string and a timing chart for illustration of operation of the concrete construction of the embodiment of the variable-length code decoder according to the present invention.

FIG. 7 shows a code data bit string for illustration and a timing chart. In the figure, the clock represents a system clock operating the variable-length code decoder shown in FIG. 2 (clock is not shown in FIG. 2), the variable-length code data represents the variable-length code data of 2 bits, the output of the decoding memory represents the output value of the decoding memory 5, and the selection signal (the node of the Huffman tree) and the decoded symbol represent the signal outputted from the latch 7. The variable-length code data is assumed to be 0100110001. . . Before starting the decoding operation, necessary data is written to the decoding memory 5 as initialization. After completing the initialization, 2 bits of top of the length of the variable-length code data (01) is inputted to the decoding memory 5 (CO cycle of the timing chart in FIG. 7). Since the variable-length code data is 01, the data d1 of address 1 (S2/a1, S2/a2) is read from the decoding memory 5 (C1 cycle). At this time, because the selection signal (node of the Huffman tree) is S1, S2/a1 is selected from d1 (C1 cycle) and as a result the selection signal is S2 and the decoded symbol is a1 in C2 cycle. In C1 cycle, the variable-length code data 00 is inputted to the decoding memory 5, and the data d0 of the address 0 (S1/a1a2, S1/a2a1) is read from the decoding memory 5 (C2 cycle). At this time, since the selection signal (the node of the Huffman tree) is S2, S1/a2a1 is selected from d0, and as a result, the node of the Huffman tree is S1 and the decoded symbol is a2a1 in C3 cycle. Repeat of these processes makes the variable-length code data 11 in C2 cycle, 00 in C3 cycle and O1 in C4 cycle, and in accordance with them, the decoded symbol is made to be a3 in C4 cycle, a1a1 in C5 cycle and a1 in C6 cycle.

As the example described above shows, one or more codewords can be decoded in every one cycle by setting the bit width of the variable-length code data according to the maximum codeword length. That is, the decoding can be carried out at a speed as twice as that of the conventional variable-length code decoder. If the bit width of the variable-length code data is set to be longer than the maximum codeword length, the decoding at a higher speed can be realized. If the bit width of the variable-length code data is set to be smaller than the maximum codeword length, the capacity of the decoding memory 5 can be reduced. In such a case, one code sometimes cannot be decoded in one cycle. In this case, the decoding data is empty and only the node data of the Huffman tree is outputted.

As shown in FIG. 3, the capacity of the decoding memory 5 depends on the bit width m of the variable-length code data. Therefore, in the case such that the decoding is currently carried out with the bit width of 10 bits and next carried out with the bit width of 5 bits, empty space is generated in the decoding memory 5. However, as described above, the necessary data is written to the decoding memory 5 only at the time of initialization before starting the decoding operation, and the decoding memory 5 is read only in decoding. Consequently, if the decoding memory 5 is constituted by, for example, a dual port memory or the like, the empty space can be effectively utilized in other task.

The means for storing the node (state) of the Huffman tree in the next decoding cycle and the decoded symbol in the current decoding cycle can be constructed utilizing a logical circuit such as PLA as well as utilizing the memory as described above.

According to the variable-length code decoder, one decoding operation in every one cycle can be executed even if the operation frequency is increased (for example, 70 MHz or more). If the code data is fetched with the bit width of the maximum codeword length, one or more codes can be decoded in one cycle. That is, the decoding processing requires only one cycle though it has required two cycles according to the conventional art, thereby the decoding process can be carried out at the speed as twice as that of the conventional variable-length code decoder. In the case where the decoded symbol generator is constituted by the dual port memory or the like, even if an empty space is generated in the dual port memory or the like, it is effectively utilized in other task.

In this embodiment, the selector 6 fetches all contents stored in the decoding memory 5 in the address of the code value 1 (that is, in each of all nodes (states), a pair of the node next thereto and the decoded symbol when the node is inputted), and moreover selects the pair of the next node and the decoded symbol to be fetched according to the selection signal 4 from the contents previously fetched. It is also possible to make the selector 6 fetch the contents of the decoding memory 5 in which the contents are arranged in two-dimensional configuration according to the code value 1 and the selection signal 4. Consequently, fetching only one pair of the next node and decoded symbol from the decoding memory 5 suffices for processing.

The foregoing description of preferred embodiment of this invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A variable-length code decoder which inputs a code data bit string having a predetermined number of code data bits in every decoding cycle and decodes it, comprising:

storing means for storing a decoded symbol on a node in a code tree in the next decoding cycle corresponding to each combination of a value of said code data bit string and a node in the code tree;

reading means for reading said decoded symbol and said node in the code tree in the next decoding cycle from said storing means in accordance with said code data bit string inputted in a current decoding cycle and said node in the code tree in the current decoding cycle; and providing means for providing said node in the code tree in the next decoding cycle read by said reading means to said reading means wherein said providing means stores said decoded symbol and said node in the code tree in the next decoding cycle received from said reading means and outputs said decoded symbol.

2. The variable-length code decoder according to claim 1, wherein said storing means is a dual port memory.

3. The variable-length code decoder according to claim 1, wherein said storing means is a programmable logical array.

4. The variable-length code decoder of claim 1, wherein said providing means includes a latch.

5. A variable-length code decoder which inputs a code data bit string having a predetermined number of code data bits in every decoding cycle and decodes it, comprising:

inputting means for inputting a code data bit string shorter than a maximum length code data bit string expressing a single decoded data in each decoding cycle;

storing means for storing a decoded symbol including an empty symbol and a node in a code tree in the next decoding cycle corresponding to each combination of a value of said code data bit string and a node in the code tree;

reading means for reading said decoded symbol and said node in the code tree in the next decoding cycle from said storing means in accordance with said code data bit string inputted by said inputting means in a current decoding cycle and said node in the code tree in the current decoding cycle;

outputting means for outputting said decoded symbol read by said reading means; and providing means for providing said node in the code tree in the next decoding cycle read by said reading means to said reading means.

6. The variable-length code decoder according to claim 5, wherein said storing means is a dual port memory.

7. The variable-length code decoder of claim 6, wherein said providing means includes a latch.

8. The variable-length code decoder according to claim 5, wherein said storing means is a programmable logical array.

9. The variable-length code decoder of claim 5, wherein said providing means includes a latch.

10. A variable-length code decoder which inputs a code data bit string having a predetermined number of code data bits in every decoding cycle and decodes it, comprising:

inputting means for inputting a code data bit string which is the same as or longer than a maximum length code data bit string expressing a single decoded data in each decoding cycle;

storing means for storing a node in a code tree in the next decoding cycle and plural decoded symbols in the case where the number of links in the code tree between a current node and a decoded symbol is less than a value of the length of said code data bit string and the number of links in the code tree between a starting node and said decoded symbol is the same or less than the length of remainder of said code data bit string, and a single decoded symbol in any other cases corresponding to each combination of a value of said code data bit string and a node in the code tree;

reading means for reading said decoded symbol and said node in the code tree in the next decoding cycle from said storing means in accordance with said code data bit string inputted by said inputting means in a current decoding cycle and said node in the code tree in the current decoding cycle;

outputting means for outputting said decoded symbol read by said reading means; and providing means for providing said node in the code tree in the next decoding cycle read by said reading means to said reading means.

11. The variable-length code decoder according to claim 10, wherein said storing means is a dual port memory.

12. The variable-length code decoder according to claim 10, wherein said storing means is a programmable logical array.

13. A variable-length code decoder which inputs a code data bit string having a predetermined number of code data bits in every decoding cycle and decodes it, comprising:

a decoding memory for storing a decoded symbol and a node in a code tree in the next decoding cycle corresponding to each combination of a value of said code data bit string and a node in the code tree;

a selector for selecting said decoded symbol and said node in the code tree in the next decoding cycle from said decoding memory in accordance with said code data bit string inputted in a current decoding cycle and said node in the code tree in the current decoding cycle, wherein said selector outputs said decoded symbol and said node in the code tree in the next decoding cycle; and a latch for storing the output from said selector, wherein said latch provides said node in the code tree from the next decoding cycle selected by said selector to said selector and outputs said decoded symbol selected by said selector.

* * * * *